(12) United States Patent
Coglitore et al.

(10) Patent No.: US 7,372,695 B2
(45) Date of Patent: May 13, 2008

(54) DIRECTIONAL FAN ASSEMBLY

(75) Inventors: Giovanni Coglitore, Saratoga, CA (US); Matthew P. Casebolt, Fremont, CA (US); Jack E. Randall, Felton, CA (US); Nikolai S. Gallo, Menlo Park, CA (US)

(73) Assignee: Rackable Systems, Inc., Fremont, CA (US)

( * ) Notice: Subject to any disclaimer, the term of this patent is extended or adjusted under 35 U.S.C. 154(b) by 384 days.

(21) Appl. No.: 11/125,423

(22) Filed: May 9, 2005

(65) Prior Publication Data

US 2005/0280986 A1 Dec. 22, 2005

Related U.S. Application Data

(60) Provisional application No. 60/569,019, filed on May 7, 2004, provisional application No. 60/569,020, filed on May 7, 2004, provisional application No. 60/568,969, filed on May 7, 2004, provisional application No. 60/569,025, filed on May 7, 2004.

(51) Int. Cl.
*G06F 1/20* (2006.01)
(52) U.S. Cl. ............................ 361/687
(58) Field of Classification Search ............. 361/687
See application file for complete search history.

(56) References Cited

U.S. PATENT DOCUMENTS

| | | | |
|---|---|---|---|
| 5,202,536 A | 4/1993 | Buonanno | |
| 5,347,430 A | 9/1994 | Curlee et al. | |
| 5,351,176 A | 9/1994 | Smith et al. | |
| 5,684,271 A | 11/1997 | Scholder et al. | |
| 5,726,866 A | 3/1998 | Allen | |
| 6,163,454 A | 12/2000 | Strickler | |
| 6,215,659 B1 | 4/2001 | Chen | |
| 6,252,160 B1 | 6/2001 | Chang et al. | |
| 6,349,042 B1 | 2/2002 | Mills et al. | |
| 6,374,627 B1 * | 4/2002 | Schumacher et al. | 62/259.2 |
| 6,414,851 B2 | 7/2002 | Cherniski et al. | |
| 6,477,061 B1 | 11/2002 | Johnson | |
| 6,480,398 B1 | 11/2002 | Fiora et al. | |
| 6,496,366 B1 | 12/2002 | Coglitore et al. | |
| 6,512,673 B1 | 1/2003 | Wiley | |
| 6,560,114 B2 | 5/2003 | Berry et al. | |
| 6,592,449 B2 * | 7/2003 | Cipolla et al. | 361/687 |
| 6,621,000 B2 | 9/2003 | Jensen et al. | |
| 6,704,196 B1 * | 3/2004 | Rodriguez et al. | 361/687 |
| 6,862,173 B1 | 3/2005 | Konshak et al. | |
| 6,867,967 B2 * | 3/2005 | Mok | 361/687 |
| 7,042,720 B1 | 5/2006 | Konshak et al. | |
| 2003/0124971 A1 | 7/2003 | Williams | |
| 2003/0128516 A1 | 7/2003 | Faneuf et al. | |
| 2004/0099747 A1 * | 5/2004 | Johnson et al. | 236/49.3 |
| 2005/0265004 A1 | 12/2005 | Coglitore et al. | |

* cited by examiner

*Primary Examiner*—Lisa Lea-Edmonds
(74) *Attorney, Agent, or Firm*—Cooley Godward Kronish LLP (57) ABSTRACT

A computer system having a fan assembly is provided. In one example, the computer system includes a computer chassis for mounting with a computer rack, the computer chassis comprising a front portion and a rear portion and including a main board. The computer system further includes a fan assembly positioned adjacent to a rear portion of the computer chassis, the fan assembly configured to draw air through the computer toward the rear portion of the computer chassis along a first direction and to expel the air in a second airflow direction non-parallel with the first direction.

20 Claims, 8 Drawing Sheets

DIRECTIONAL FAN ASSEMBLY

RELATED APPLICATION

The present application claims the benefit of U.S. Provisional Patent Application No. 60/569,019, filed May 7, 2004 and entitled "DIRECTIONAL FAN ASSEMBLY", U.S. Provisional Patent Application No. 60/569,020, filed on May 7, 2004 and entitled "ELECTROMAGNETIC INTERFERENCE SHIELD FOR I/O PORTS"; U.S. Provisional Patent Application No. 60/568,969, filed May 7, 2004 and entitled "INTERFACE ASSEMBLY"; and U.S. Provisional Patent Application No. 60/569,025, filed May 7, 2004, entitled "RACK MOUNTED COMPUTER SYSTEM"; all of which are hereby incorporated by reference as if fully set forth herein.

BACKGROUND

1. Field

This is related generally to electronic equipment, such as computer systems for use in a rack-based computer system. Certain aspects relate to methods and systems for moving air within computer systems and rack based-computer systems.

2. Description of Related Art

As information technology has rapidly progressed, computer network centers such as server farms and server clusters have become increasingly important to our society. The server farms provide efficient data processing, storage, and distribution capability that supports a worldwide information infrastructure, which has come to dominate how we live and how we conduct our day to day business. A server farm is a group or cluster of computers acting as servers and housed together in a single location. For example, a Web server farm may be either a Web site that has more than one server, or an Internet service provider that provides Web hosting services using multiple servers. In a business network, a server farm or cluster might perform such services as providing centralized access control, file access, printer sharing, and backup for workstation users.

Typically, at a site where numerous computers are connected to a network, the computers are stacked in racks and arranged in repeating rows or cells. Access to the computers may be needed for servicing, upgrading hardware, loading software, attaching cables, switching power on and off, and so forth. The elimination of as much access space as is feasible can increase the density of computer systems that may be provided for a given square footage of area at a site.

A standard rack that is widely used measures roughly 19 inches wide, 30 inches deep and 74 inches high. These racks may be arranged in rows of, for example, roughly 10-30 units, with access doors on each side of the racks. Access aisles are provided on both sides of the rows so that an operator may approach the access doors on each side. Many of the racks are filled with cumbersome computers mounted on sliders which are attached through mounting holes provided in the front and back of the rack.

In conventional rack-based computer systems, a plurality of computers are supported in a single stack in a rack. The rack may comprise a cabinet assembly having a front door and a back door. Each of the computers typically comprises a computer chassis having a motherboard and other components, such as one or more power supplies, hard drives, processors, expansion cards, contained within the chassis. The front door of the cabinet assembly provides access to the front sides of the computers and the back door provides access to the back sides, where the I/O ports for the computer are typically provided. Each computer may also include one or more fans that draw ambient air into vents provided on one side of the computer, through the computer chassis, and out of vents provided on the opposite side of the computer. The ambient air passing through the computers is used to cool the various components contained within the computer chassis.

As the number of computers in a server farm is increased, two competing factors come into play: consumption of floor space and heat management. As one increases the density of computers, problems associated with heat dissipation rise dramatically. One of the major causes of electronic component failure is overheating. High performance electronics such as CPUs generate substantial amounts of heat. Hard drives and power supplies emit substantial amounts of heat as well, thereby placing further demands on effective heat dissipation. In order for computers to continue to operate properly, appropriate heat dissipation pathways should be provided. Because each computer contains thousands of heat producing electronic parts, as the density of the computers is increased, one must also address the difficult issues of providing proper cooling mechanisms to remove heat from the individual computer nodes and the clusters as a whole. Therefore, it is desirable to provide an improved cooling system for rack-based computer systems.

SUMMARY OF THE INVENTION

According to one aspect of the present invention, a computer system is provided. In one example, the computer system includes a computer chassis for mounting in a computer rack, the computer chassis comprising a front portion and a rear portion and including a main board. The computer system further includes a fan assembly positioned adjacent to a rear portion of the computer chassis, the fan assembly configured to draw air through the computer chassis in a first airflow direction toward the rear portion (e.g., from the front portion to the rear portion) of the computer chassis and to expel the air in a second airflow direction non-parallel with the first direction.

According to another example, the computer system includes a computer system comprising a rack assembly, a plurality of computer chassis mounted with the computer rack assembly, and a fan assembly. The fan assembly is positioned adjacent a rear portion of at least one of the computer chassis, the fan assembly configured to draw air through the computer chassis in a first airflow direction from the front portion to the rear portion of the computer chassis and to expel the air in a second airflow direction non-parallel with the first direction.

According to another aspect, a method for operating a plurality of computers disposed within a rack assembly having a vertical axis is provided. The method includes operating one or more of the computers, which includes a main board that generates heat during operation. Further, operating a fan assembly to draw air across, over, or adjacent the main board of the computer and to direct the air in a direction non-orthogonal with the vertical axis.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

DETAILED DESCRIPTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Figure 1:
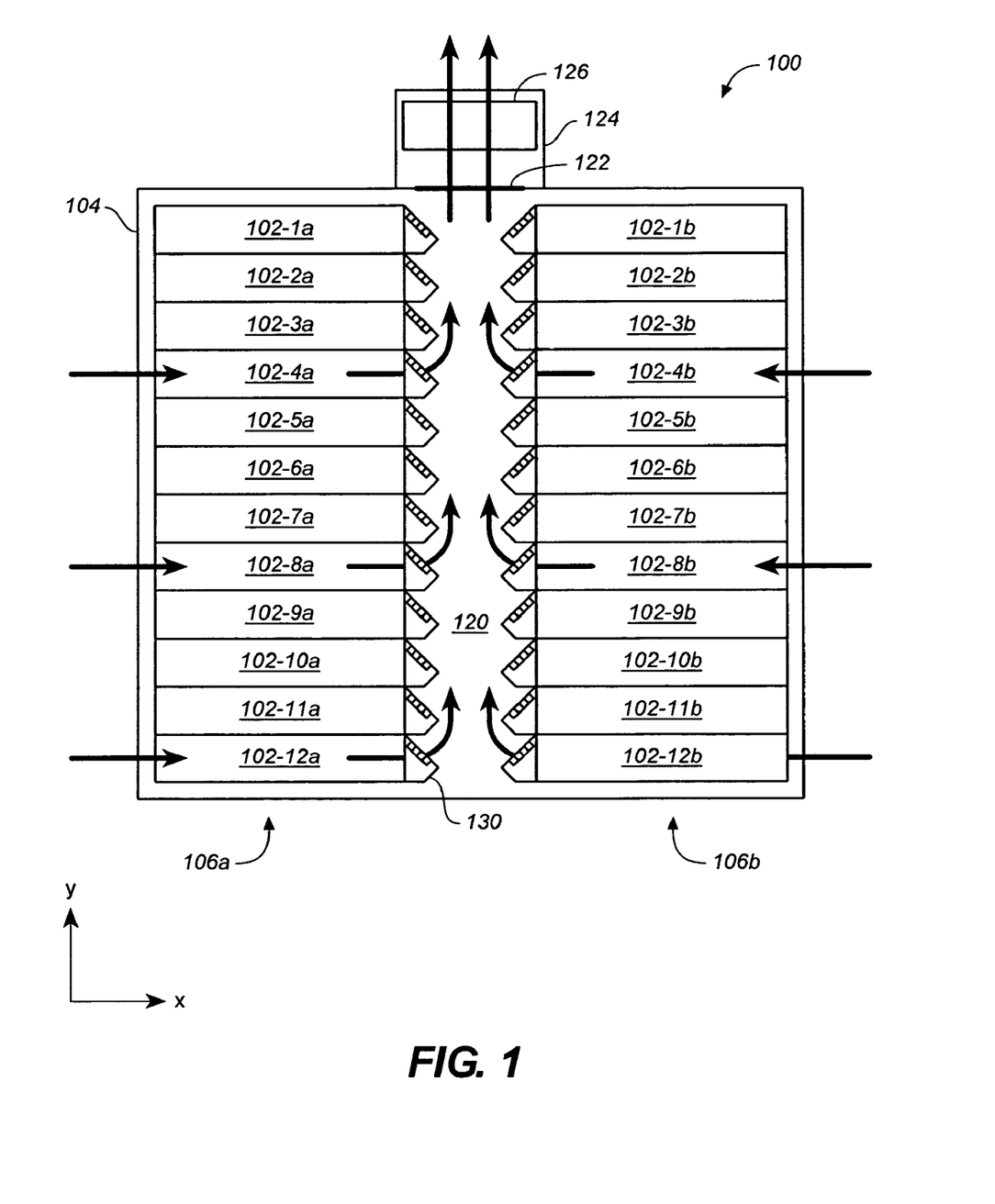
FIG. 1 is a simplified cross-sectional side view of a computer system, in accordance with embodiments of the present invention.

FIG. 1 shows a simplified cross-sectional side view of a rack-based computer system 100 comprising a rack assembly 104 having a plurality of computers 102 (i.e., 102-1a through 102-12a and 102-1b through 102-12b) supported therein, in accordance with embodiments of the present invention. In some embodiments, the rack assembly 104 may comprise a rack structure and a cabinet housing or enclosure surrounding the rack structure. Each of the computers 102 may have a front side and an opposing back side, a top and an opposing bottom, and two opposing lateral sides. As can be seen in the embodiment shown in FIG. 1, the computers 102 are supported in two stacks 106a, 106b in a back-to-back arrangement such that the back sides of the computers 102 face inward and the front sides of the computers 102 face outward. This arrangement can allow a user to access the front sides of the computers 102 in both stacks 106a, 106b without removing the computers 102 from the rack assembly 104.

The two stacks 106a-106b of computers 102 and the rack assembly 104 cooperate to form a cooling air plenum 120. The rack assembly 104 may comprise, for example, a standard-sized rack, or may have different dimensions. In one embodiment, the rack assembly 104 measures approximately 24" wide, 40" deep, and 74" high. A similar arrangement of computers 102 is described in U.S. Pat. No. 6,496,366, incorporated by reference herein in its entirety. In another embodiment, four stacks of computers 102 are provided in the rack assembly 104. A first pair of stacks are positioned side-by-side in a front region of the rack assembly 104 and a second pair of stack are positioned side-by-side in a back region of the rack assembly 104 such that the back sides of the computers in the first pair of stacks face the back sides of the computers in the second pair of stacks. An exemplary rack assembly and arrangement of computers is described in greater detail in the following provisional U.S. patent applications, all filed on May 7$^{th}$, 2004, the disclosures of which are incorporated by reference herein in their entireties: provisional patent application Nos. 60/568,969, 60/569,025, and 60/569,020.

A computer may include any electronic system designed to perform computations and/or data processing. In some embodiments, the computer includes an electronic device having a central processing unit (CPU) and memory. The CPU and memory may be provided on a main board and may be contained within a housing. Alternatively, the computer may comprise a printed circuit board (PCB) having exposed components without an enclosure. The PCB main board may be mounted onto a chassis structure, such as, for example, a sheet of metal or a supporting frame. Multiple computer components, such as, e.g., hard drives, power supplies, processors, memory modules, cables, etc., may be mounted on or coupled to the main board of the computer. In some embodiments, computers 102 in rack assembly 104 comprise server-class computers. A server is a computer on a network that manages network resources. The server may be dedicated to a particular purpose and may store data and/or perform various functions for that purpose.

The cooling air plenum 120 may be coupled to an exhaust port 122 located, for example, at the top and/or bottom of the rack assembly 104. The exhaust port 122 may be coupled to a vent hood 124. One or more air movers 126 may be provided within the vent hood 124, or may be omitted as will be described in greater detail below. One or more of the computers 102 may be provided with a directional fan assembly 130 that is configured to draw air through a computer 102 associated therewith and direct the air into the cooling air plenum 120 towards the exhaust port 122.

The cooling air moved by the directional fan assembly 130 flows through computers 102 in a first direction approximately parallel to the plane formed by the main board of the computer 102 (shown in FIG. 1 as the x-z plane, with the z-axis being perpendicular to the page). When the cooling air reaches the fan assembly 130, the fan assembly 130 redirects the flow of cooling air into a second direction non-parallel with the first direction. By pulling the cooling air through the computers 102 and directing the flow of cooling air in the second direction, the fan assemblies 130 are capable of creating an airflow in the cooling air plenum sufficient to force air through the exhaust port 122 and out of the computer system 100. In some embodiments, the directional fan assemblies 130 may induce an airflow sufficient to move substantially all of the heated cooling air out of the computer system 100, thereby enabling the elimination of the air movers 126 at the top of the rack assembly 104. In other embodiments, the air movers 126 may be used as a supplement or as a backup for the fan assemblies 130.

Figure 2:
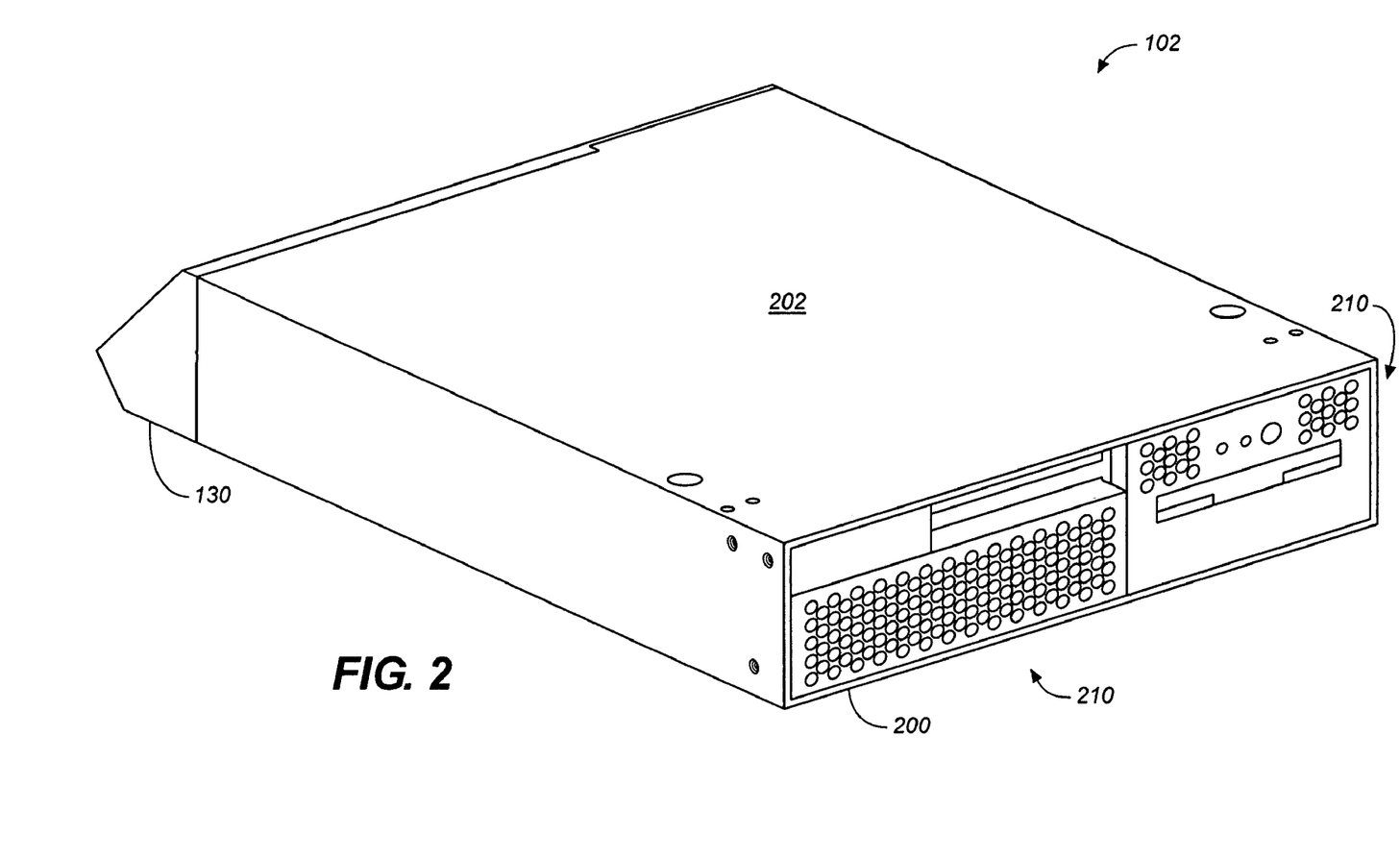
FIG. 2 is a front perspective view of a computer chassis, in accordance with embodiments of the present invention.
Figure 3:
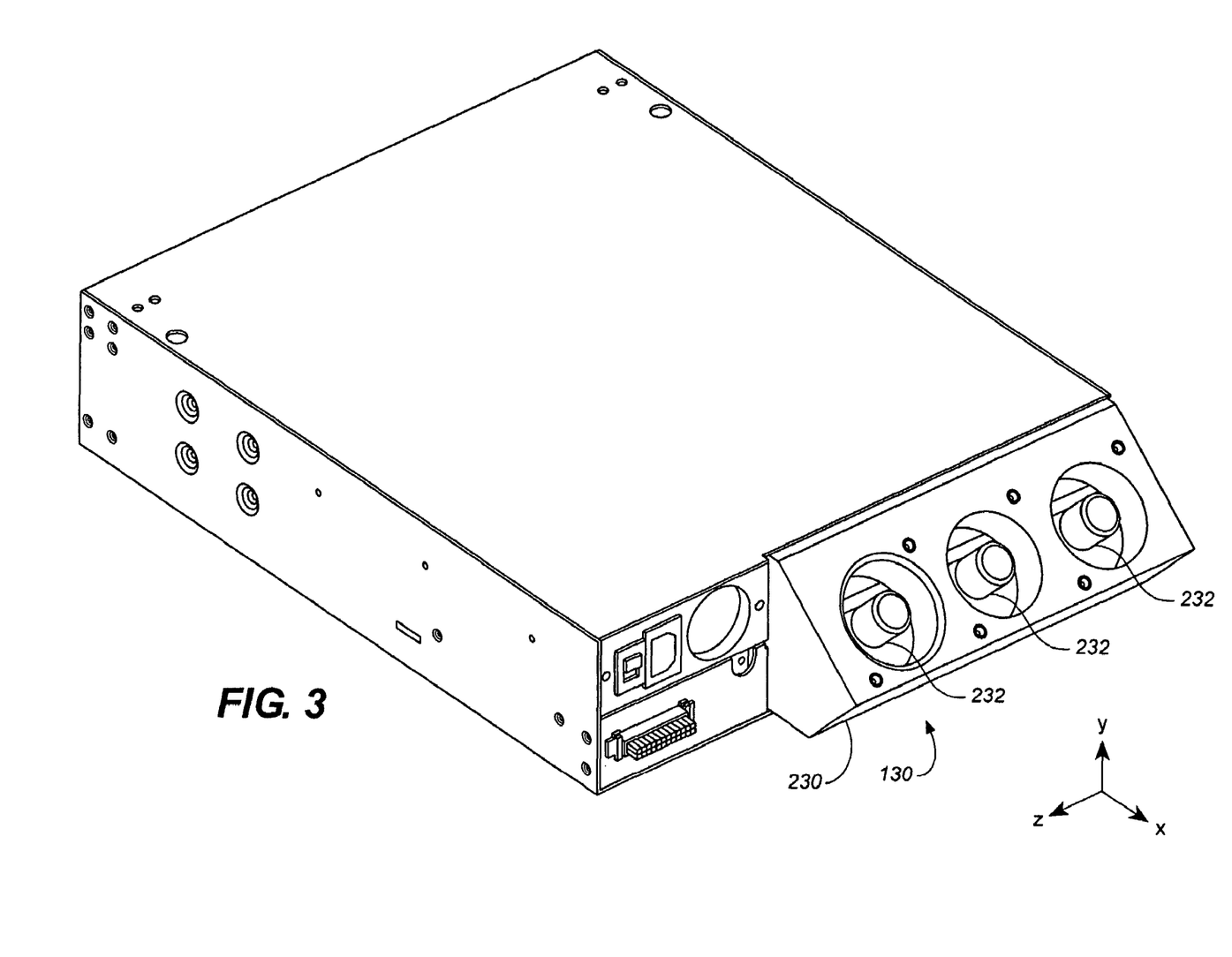
FIG. 3 is a rear perspective view of a computer chassis, in accordance with embodiments of the present invention.
Figure 4:
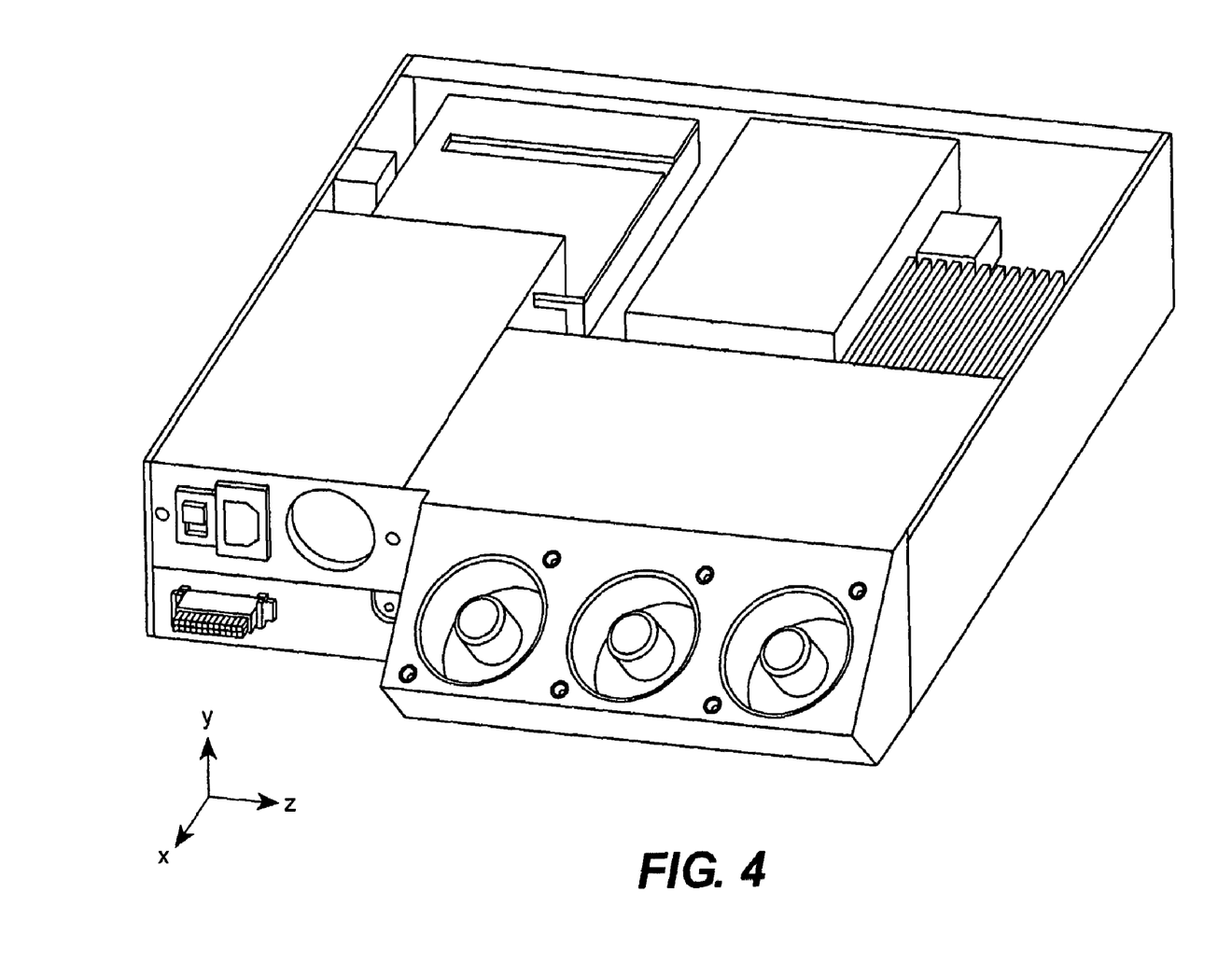
FIG. 4 is a rear perspective view of a computer chassis with the cover removed to expose interior components, in accordance with embodiments of the present invention.

FIG. 2 is a front perspective view of a computer 102, in accordance with an embodiment of the present invention. FIG. 3 is a rear perspective view of the computer 102, and FIG. 4 is a rear perspective view of the computer 102 with the computer case 202 removed, thereby exposing the internal components of the computer 102. In this embodiment, the computer 102 comprises a computer chassis 200 which provides the mechanical structure onto which or within which the various computer components, such as the main board, hard drives, and power supplies, are mounted. The computer chassis 200 may comprise a computer case 202, which may comprise a piece of sheet metal shaped to provide a protective shell for the computer. Various cooling airflow vents 210 may be provided in the computer 102 to allow cooling air to flow into the interior of computer 102. In FIG. 1, the inlet vents 210 are provided on the front side of the computer 102. In other embodiments, vents may be formed on other sides or multiple sides of the computer 102. In yet other embodiments where the computer 102 does not have side walls, the air may freely flow from the exterior of the rack assembly over the main board and other computer components.

As shown in FIGS. 1-4, fan assembly 130 may be attached to the back side of computer 102. In the illustrated embodiment, the fan assembly 130 comprises a body 230 supporting three fans 232, each fan comprising rotatable fan blades for moving air. The fan assembly 130 is attached to the back side of the computer chassis 200, which includes a rectangular opening that allows air to flow from the interior of the computer 102 into the body 230 of the fan assembly 130. While the fan assembly 130 in the illustrated embodiment can be removed from the computer chassis 200, in other embodiments, the fan assembly 130 may be integrally formed with the computer chassis 200 such that the two components are not separable. In yet other embodiments, the fan assembly 130 may be partially or completely supported by a structure other than the computer chassis 200. For example, in some embodiments, the fan assembly 130 may be coupled to the rack assembly 104 such that the fan assembly 130 is positioned adjacent to one or more computers 102, but not physically attached to any of the computers 102.

In the illustrated embodiment, the fans 232 are configured to draw air out of the interior and through the back side of the computer 102, while the inlet vents 210 allow air to pass into the interior through the front side of the computer 102. This creates a general flow of air through the computer 102 in a first direction (shown as the x-direction). It will be understood that the various structures within the computer 102 may cause turbulence and other airflow in directions other than the x-direction. However, the general flow through each computer 102 will occur from front-to-back in a plane parallel with the main board. In other embodiments, the air may flow through each computer 102 from the sides, top, and/or bottom and out of the back side. In these embodiments, the general direction of airflow may not be front-to-back, but remains parallel with the main board of the computer 102.

Figure 5:
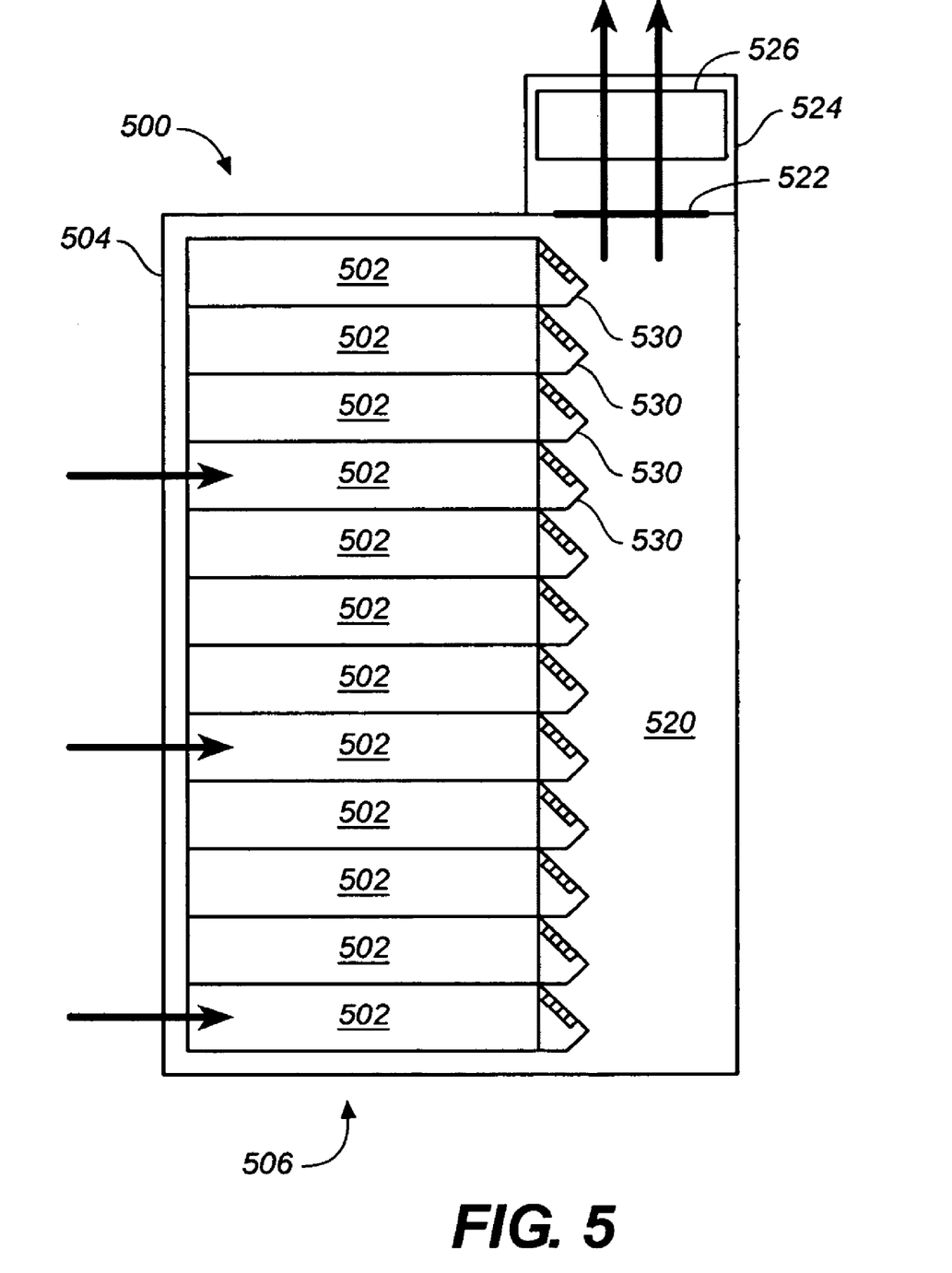
FIG. 5 shows a simplified cross-sectional side view of a computer system having a single stack of computers, in accordance with embodiments of the present invention.

While the above-mentioned embodiments refer to a computer system 100 having two stacks 106a-106b of computers 102 arranged in a back-to-back configuration, embodiments of the present invention may be utilized in other configurations as well. For example, FIG. 5 shows a simplified block diagram of a computer system 500 having a single stack 506 of computers 502. As in the computer system 100 shown in FIG. 1, one or more fan assemblies 530 are provided to draw air out of computers 502 to a cooling air plenum 520, and further to redirect the airflow towards exhaust port 522 of plenum 520. As with system 100, a vent hood 524 and additional air movers 526 may optionally be provided to assist with drawing air away from the computers 502 out of the rack assembly 504.

In accordance with embodiments of the present invention, one or more directional fan assemblies may be provided to draw cooling air from one or more computers and to redirect the flow of air. The airflow may be redirected to flow up and out of the top portion of the rack assembly or down and out of the bottom portion of the rack assembly. In some embodiments, the computers positioned near the top of the rack assembly may have directional fan assemblies configured to redirect the airflow from the computers out of the top of the rack assembly, while the computers positioned near the bottom of the rack assembly may have directional fan assemblies configured to redirect the airflow from those lower computers out of the bottom of the rack assembly. This redirection of airflow may effectuate the cooling of the computers and the exhaustion of the heated cooling air out of the rack assembly without the use of additional air movers positioned near the exhaust port. In embodiments where the redirected cooling air flows in an enclosed space, such as the enclosed cooling air plenum 120 shown in FIG. 1, the walls of the plenum may further redirect the air to flow towards the exhaust port 122.

In a typical computer, one or more primary fans are positioned inside the computers adjacent the vents along one of the sides of the computer. These fans are used either to draw air out of the interior of the computer and expel the air out of the side, or to draw ambient air into the interior of the computer. Typically, these fans are provided along the back sides of the computers to create an airflow into the front of the computers and out of the backs of the computers. When computers having conventional fans are positioned in a rack assembly, the fans merely draw the air from the computers and direct the air straight out of the back sides of the computers. If the rack assembly is configured such that this exhausted air can flow unconstrained away from the computers, the cooling provided by these fans may be sufficient. However, when there are constraints on the flow of this exhaust air or when the amount of heat being generated by the computers is too excessive, the cooling air which has been heated by the components of the computers may not be effectively drawn away from the computers. This can reduce the effectiveness of the cooling airflow. These constraints on the exhausted air can be caused, for example, if the rack assembly is partially or fully enclosed, thereby preventing the cooling air from flowing straight out and away from of the rear portions of the computers. This can also be caused if other structures are positioned close to the rear portions of the computers, thereby blocking the free flow of air. In various situations, it may be desirable to draw the air from the computers in a first direction across the heat-generating components of the computer (e.g., front to back) and then redirect the air emerging from the computer in another direction (e.g., upwards).

Figure 6:
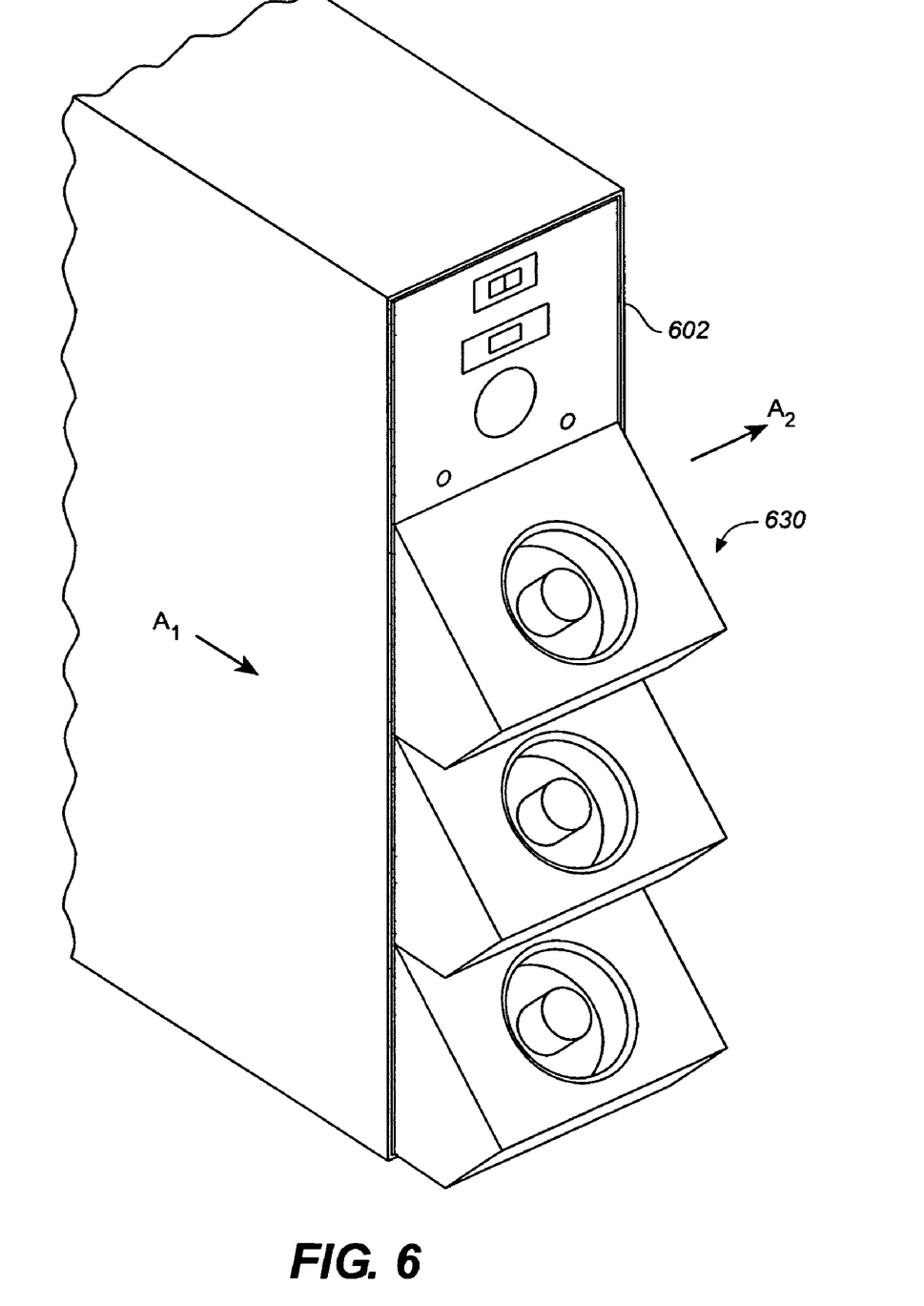
FIG. 6 is a rear perspective view of a computer chassis with a fan assembly, in accordance with other embodiments of the present invention.

In the embodiments described above, the computers are positioned such that the main boards of the computers are horizontally arranged. In other embodiments, the computers may have different arrangements. For example, the computer 602 shown in FIG. 6 may be positioned such that the main board is vertically arranged in a rack assembly. In this embodiment, the fan assembly 630 is configured to draw air across the main board contained in the computer 602 in a general airflow direction $A_1$, and then redirect air upwards after the cooling air has passed the main board and exited the computer 602. Because the main board in this example is positioned vertically, the redirected airflow continues to flow in a direction $A_2$ approximately parallel to the plane of the main board, but non-parallel with the general airflow direction $A_1$ within the computer 602.

Figure 7A:
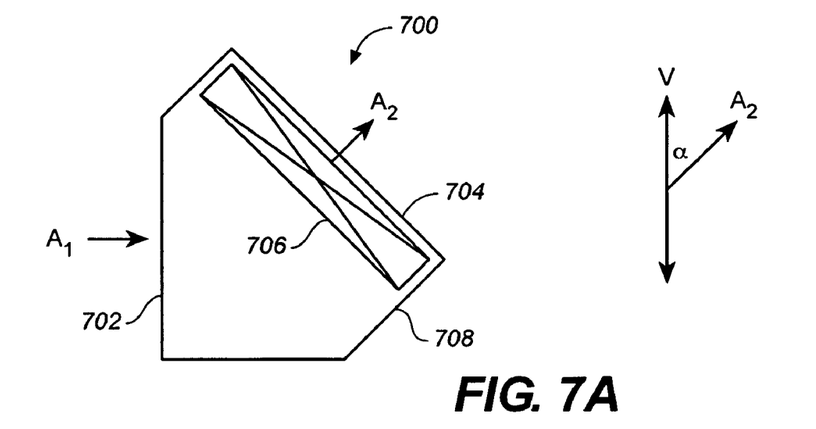
FIGS. 7A-7C show cross-sectional views of various fan assemblies, in accordance with embodiments of the present invention.
Figure 7B:
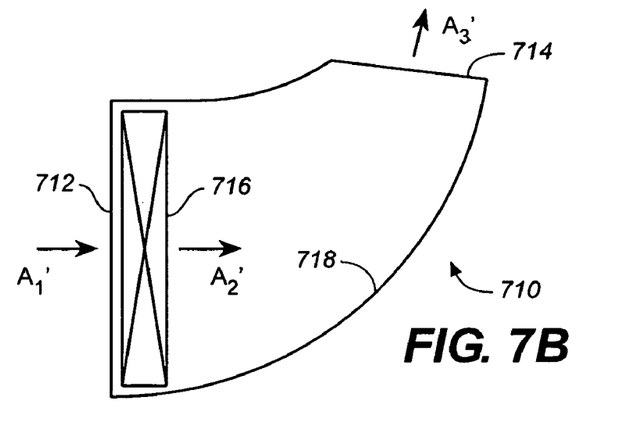
Figure 7C:
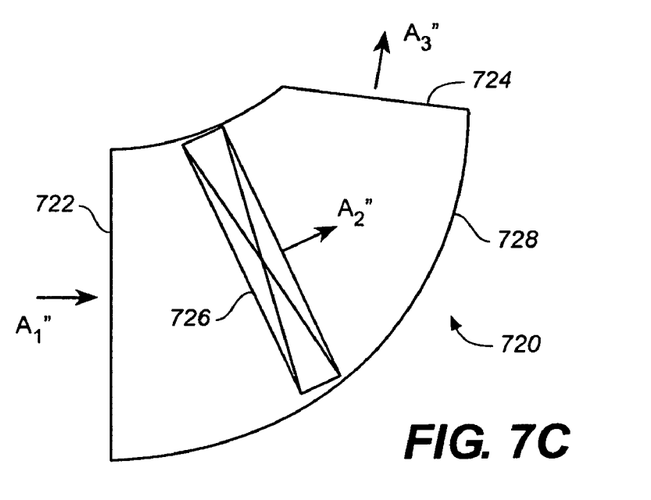

The directional fan assemblies may take different forms. FIGS. 7A-7C show directional fan assemblies in accordance with various embodiments of the present invention. In FIG. 7A, the fan assembly 700 includes an inlet port 702, which is configured to be coupled to or positioned adjacent to a side of a computer, and an outlet port 704. The fan assembly 700 also comprises a fan 706 and a shroud portion 708. With this fan arrangement, air enters the inlet port 702 in a general airflow direction $A_1$ and is drawn by the fan 706 through the shroud portion 708 of the fan assembly 700. The fan 706 expels air generally in the direction $A_2$, which is non-parallel with $A_1$.

FIG. 7B shows a fan assembly 710, which comprises an inlet port 712, a fan 716, a shroud portion 718, and an outlet port 714. In this embodiment, the fan 716 draws air into the fan assembly 710 in a general direction $A_1'$, and forces the air into the shroud portion 718 in a general direction $A_2'$, which is approximately parallel to $A_1'$. The shroud portion 718 causes the airflow to change directions such that the airflow has a general direction $A_3'$ as it exits from outlet port 714. Direction $A_3'$ is non-parallel with $A_1'$ and $A_2'$, and in some embodiments directs the airflow towards an exhaust port of the rack assembly.

FIG. 7C shows a fan assembly 720, which comprises an inlet port 722, a fan 726, a shroud portion 728, and an outlet port 724. As with fan assemblies 700 and 710, the air from the computer is drawn into the inlet port 722 in a general direction $A_1''$. In this embodiment, the fan 726 is positioned at an angle with the inlet port 722 such that the air emitted by the fan 726 has a general direction $A_2''$, which is non-parallel with $A_1'$. After passing the fan 726, the direction of airflow is further redirected by the shroud portion 728, which causes the airflow to change to a general direction $A_3''$ (which is non-parallel with $A_1''$ and $A_2''$) as it exits from outlet port 724.

Figure 8:
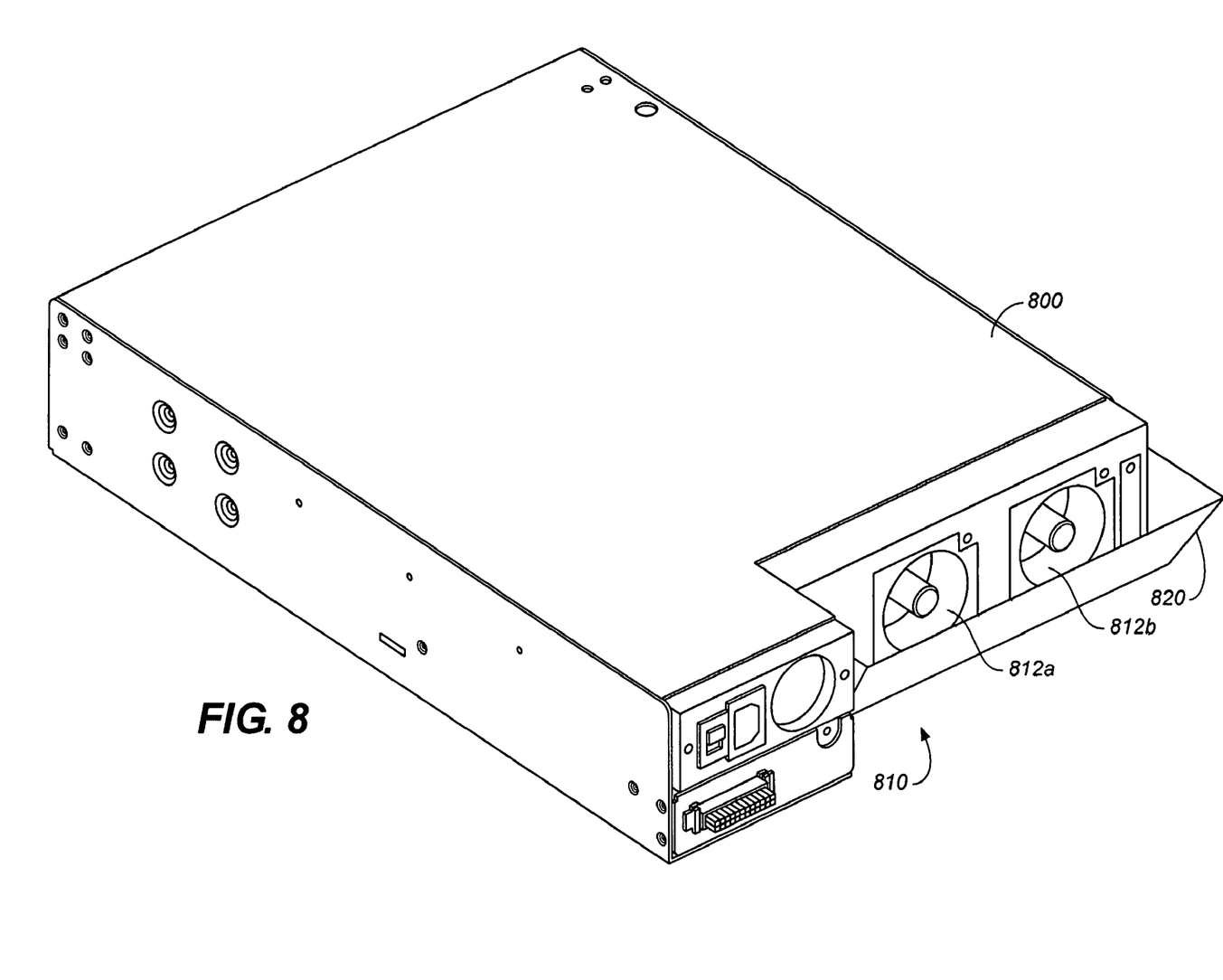
FIG. 8 is a rear perspective view of a computer chassis with a fan assembly, in accordance with another embodiment of the present invention.

FIG. 8 is a rear perspective view of a computer chassis 800 with a fan assembly 810, in accordance with other embodiments of the present invention. This arrangement is similar to the arrangement for computer chassis 200 described above, except fan assembly 810 comprises fans 812a-812b, which are configured to draw air out of the interior of computer chassis 800 and expel the air in a direction approximately parallel to the plane defined by the main board contained in computer chassis 800. Further, fan assembly 810 comprises deflection shield 820, which is coupled to the back side of computer chassis 800 disposed adjacent to the exhaust port for the fans 812a-812b. As the cooling air is exhausted out of the fans 812a-812b, the flow of air is redirected by the deflection shield 820 in an upwards direction. As described above, this can help to direct the airflow upwards through the cooling air plenum 520 and out of the rack assembly 504. Deflection shield 820 may include one or more members positioned in any suitable fashion to affect a desired directional flow of the cooling air.

In accordance with embodiments of the present invention, directional fan assemblies may be provided for changing the direction of airflow used to cool computers in a rack system. The redirection of airflow may be particularly advantageous when it is desired to direct cooling air either up, down, or to the side of the rack, rather than straight back, as is conventionally done. When the rack system is partially or fully enclosed, the redirection of air using these directional fan assemblies may be sufficient to exhaust all of the heated cooling air out of the rack system and away from the computers without the use of additional fans provided at an exhaust port of the rack assembly. This can decrease the cost of the rack assembly and reduce the number of parts that may fail and need replacement during operation.

While the invention has been described in terms of particular embodiments and illustrative figures, those of ordinary skill in the art will recognize that the invention is not limited to the embodiments or figures described. For example, the various figures show the fan assembly including one or more fans positioned at various angles relative to the back side of the computer chassis. The position and configuration of the fan assemblies may vary. In various embodiments, the fan assemblies are configured to direct cooling airflow in a direction that is not orthogonal to a vertical axis. In conventional rack-based systems, a computer includes a fan that expels air out of the back of the computer in a general direction orthogonal to the vertical axis of the rack. In contrast, in the fan assembly 700 shown in FIG. 7A, the fan 706 has blades with an axis of rotation that forms an angle a of approximately 45° with the vertical axis V. Accordingly, the cooling air expelled by the fan assembly 700 has a general direction of approximately 45° from V. In the fan assembly 710 shown in FIG. 7B, the fan 716 has blades with an axis of rotation approximately orthogonal with the vertical axis V. However, the shroud portion 718 redirects the flow of air to a direction $A_3'$ that forms an angle nearly parallel to the vertical axis V. The precise angles and configuration of the fan assemblies may vary in different embodiments.

Many of the embodiments described above refer to the computer systems being utilized as part of a server farm. In other embodiments, the computer systems may be used for other purposes, such as, for example, storage arrays. The multiple computers in a single stack may be identical or may be different. In some embodiments, the computers in a stack may have different form factors (e.g., some computers have a 1U profile, while others have a 2U or 3U profile) and may be configured to perform different tasks (e.g., one or more computers may be configured as a central controllers, while other computers in the stack may be configured as storage arrays).

In addition, while some of the embodiments described above refer to computer systems fully or partially populated with computers, it is to be understood that in other embodiments, different types of components may be mounted in one or more of the available shelf locations in the rack assembly. For example, one or more of the locations may be consumed by dedicated power supplies, routers, switches, keyboards, or other electronic components. These components may or may not be configured to utilize a flow of cooling air during operation.

In some embodiments, it may be desirable for the directional fan assemblies to be detachable from the computer chassis. Thus, an operator can easily reconfigure the computer chassis for a different airflow pattern by attaching different fan assembly to the computer chassis. This can enable a manufacturer to have a supply of identical computer chassis suitable for use with a variety of different fan assembly and rack assembly designs.

The embodiments described herein show the exhaust port being positioned at the top of the rack assembly. In other embodiments, the exhaust port may be positioned elsewhere in the system. For example, in some embodiments, the exhaust port may be positioned at the bottom of the cooling air plenum to draw the air from the back sides of the computers down to the bottom of the rack assembly. Ductwork may be provided under the floor supporting the computer system in order to channel the exhaust air away. In yet other embodiments, exhaust ports may be provided at both the top and the bottom of the cooling air plenum to draw air in both directions, or may be provided at one or more lateral sides of the rack.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

We claim:

1. A computer system, comprising:
   a rack assembly;
   a first plurality of computer chassis mounted in the rack assembly, each of the first plurality of computer chassis comprising a front portion and a rear portion and including a main board;
   at least one fan assembly positioned adjacent to the rear portion of one or more of the first plurality of computer chassis, the at least one fan assembly configured to draw air through each of the one or more of the first plurality of computer chassis in a first airflow direction toward a rear portion of each of the one or more of the first plurality of computer chassis and to expel the air in a second airflow direction non-parallel with the first direction;
   wherein the rack assembly is configured to support the first plurality of computer chassis in a first stack and a second plurality of computer chassis in a second stack such that the rear portion of each of the computer chassis in the first plurality of computer chassis faces a rear portion of each of the computer chassis in the second plurality of computer chassis.

2. The computer system of claim 1, wherein:
   each of the at least one fan assembly comprises a fan shroud configured to direct airflow from the first airflow direction to the second airflow direction.

3. The computer system of claim 1, wherein:
   each of the at least one fan assembly comprises a deflection shield configured to direct airflow from the first airflow direction to the second airflow direction.

4. The computer system of claim 1, wherein:
   each of the at least one fan assembly is coupled to one of the first plurality of computer chassis.

5. The computer system of claim 1, wherein:
   each of the first plurality of computer chassis comprises an enclosure having a top, a bottom, two opposing sides, a front, and a back, wherein the main board is positioned within the enclosure and the front and back of the enclosure include openings for allowing the passage of cooling air through the enclosure.

6. The computer system of claim 1, wherein:
   each of the at least one fan assembly comprises one or more fan, each of the one or more fans having an axis of rotation non-parallel with the first airflow direction and configured to draw air out of the computer chassis.

7. The computer system of claim 6, wherein:
   the axis of rotation for each of the one or more fans forms an angle of at least 25 degrees from the first airflow direction.

8. The computer system of claim 6, wherein:
   the axis of rotation for each of the one or more fans forms an angle of at least 45 degrees from the first airflow direction.

9. The computer system of claim 1, wherein the first plurality of computers chassis are stacked along a vertical direction and the second airflow direction is non-orthogonal to the vertical direction.

10. The computer system of claim 1, wherein:
    the rack assembly is configured to define a cooling air plenum adjacent the first plurality of computer chassis; and
    the at least one fan assembly is configured to expel the air into the cooling air plenum.

11. The computer system of claim 10, wherein:
    the at least one fan assembly is configured to expel the air into the cooling air plenum towards the top of the rack assembly.

12. The computer system of claim 10, wherein:
    the at least one fan assembly is configured to expel the air into the cooling air plenum towards the bottom of the rack assembly.

13. The computer system of claim 10, further comprising:
    an exhaust port positioned near a top portion or a bottom portion of the rack assembly such that exhaust air flowing into the cooling air plenum from the first plurality of computer chassis flows out of the exhaust port.

14. A method of operating computers comprising:
    providing a first plurality of computers positioned in a first stack in a rack assembly, each of the first plurality of computers comprising a main board, a front portion, and a rear portion;
    operating the main board in one or more of the first plurality of computers to generate heat; and
    operating at least one fan assembly to draw cooling air across the main board of one or more computers and to direct the cooling air in a direction non-orthogonal with the vertical axis;
    wherein the at least one fan assembly is positioned adjacent to the rear portion of one or more of the first plurality of computers, the at least one fan assembly configured to draw air through each of the one or more of the first plurality of computers in a first airflow direction toward the rear portion of each of the one or more of the first plurality of computers and to expel the air in a second airflow direction non-parallel with the first direction; and
    wherein the rack assembly is configured to support the first plurality of computers in the first stack and a second plurality of computers in a second stack such that the rear portion of each of the first plurality of computers faces a rear portion of each of the second plurality of computers.

15. The method of claim 14, wherein:
    the operating at least one fan assembly to direct the cooling air in the direction non-orthogonal with the vertical axis comprises operating a fan having rotating blades with an axis of rotation non-orthogonal with the vertical axis.

16. The method of claim 14, wherein:
    the operating at least one fan assembly to direct the cooling air in the direction non-orthogonal with the vertical axis comprises directing the cooling air in the direction non-orthogonal with the vertical axis using a shroud portion of the fan assembly.

17. The method of claim 14, further comprising:
    channeling the cooling air from the at least one fan assembly through a cooling air plenum up and out of the rack assembly.

18. The method of claim 14, further comprising:

channeling the cooling air from the at least one fan assembly through a cooling air plenum down and out of the rack assembly.

19. The method of claim 14, wherein:

each of the first plurality of computers comprises a computer chassis having a main board mounted thereon.

20. The method of claim 19, wherein:

the computer chassis comprises an enclosure having a top, a bottom, two opposing sides, a front, and a back, wherein the main board is positioned within the enclosure and the front and back of the enclosure include openings for allowing the passage of cooling air through the enclosure.

* * * * *